(12) United States Patent
Chong et al.

(10) Patent No.: US 7,002,384 B1
(45) Date of Patent: Feb. 21, 2006

(54) LOOP CIRCUITRY WITH LOW-PASS NOISE FILTER

(75) Inventors: Yan Chong, Mountain View, CA (US);
Joseph Huang, San Jose, CA (US);
Chiakang Sung, Milpitas, CA (US);
Philip Pan, Fremont, CA (US);
Tzung-chin Chang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 15 days.

(21) Appl. No.: 10/759,915

(22) Filed: Jan. 16, 2004

(51) Int. Cl.
*H03K 5/13* (2006.01)
*H03D 3/24* (2006.01)

(52) U.S. Cl. .................. 327/158; 327/156; 327/160
(58) Field of Classification Search ........ 327/156–158, 327/160; 331/1 A, 25; 375/373–376
See application file for complete search history.

(56) References Cited

U.S. PATENT DOCUMENTS

| | | | | |
|---|---|---|---|---|
| 5,604,775 A | * | 2/1997 | Saitoh et al. | ............... 375/376 |
| 5,771,264 A | * | 6/1998 | Lane | ........................... 375/376 |
| 6,437,650 B1 | * | 8/2002 | Sung et al. | .................... 331/25 |
| 6,504,408 B1 | * | 1/2003 | von Kaenel | ................. 327/158 |

* cited by examiner

*Primary Examiner*—Dinh T. Le
(74) *Attorney, Agent, or Firm*—Fish & Neave IP Group of Ropes & Gray LLP; Robert R. Jackson; Hong S. Lin

(57) ABSTRACT

Phase comparators for use in loop circuits (i.e., DLL circuits and PLL circuits) are provided. The phase comparators include a phase detector for comparing a reference clock signal and a feedback signal derived from the loop circuit generated internal clock signal. The phase comparators also include a low-pass noise filter for filtering out erroneously detected phase differences between the reference clock signal and the feedback signal by requiring a certain net number of leading or lagging detections before the compensation circuitry of the loop circuit (i.e., the controlled delay line in a DLL circuit or the controlled oscillator in a PLL circuit) is adjusted. The number of net measurements required before these adjustments take place depends on a programmable bandwidth signal provided to the phase comparator.

36 Claims, 5 Drawing Sheets

LOOP CIRCUITRY WITH LOW-PASS NOISE FILTER

BACKGROUND OF THE INVENTION

The present invention relates to delay-locked loop (DLL) circuits and phase-locked loop (PLL) circuits for use in, for example, programmable logic devices (PLDs). More particularly, this invention relates to DLL and PLL circuit phase comparators that include a low-pass noise filter with programmable bandwidth.

In general, a PLD is a general-purpose integrated circuit device that is programmable to perform any of a wide range of logic tasks. Instead of having to design and build separate logic circuits for performing different logic tasks, general-purpose PLDs can be programmed in various different ways to perform those different logic tasks. Many manufacturers of electronic circuitry and systems find the use of PLDs to be an advantageous way to provide various components of what they need to produce.

It is known to accommodate various input/output standards, some of which require very accurate internal clock signals, by incorporating DLL or PLL circuits on PLDs. For example, PLL and DLL circuits, collectively referred to herein as "loop circuits," are often used in PLDs in clock distribution circuits, multiphase clock generation and clock recovery circuits. In particular, loop circuits may be used to provide an internal clock signal that tracks an external, or reference, clock signal (which may come from the output of an oscillator, a different loop circuit or another suitable source). For example, a loop circuit may be used to produce an internal clock signal that is synchronized with a reference clock signal and then distributed to different regions of the PLD.

On the other hand, a loop circuit (generally, a DLL circuit) may also be used to compensate for clock skew that often occurs in a PLD (or a system) when a centralized clock signal is being distributed to many different components in the PLD. In this case, the loop circuit is used to eliminate excessive delay in the propagating clock signals by providing an internal clock signal that is advanced in time relative to the reference clock signal (rather than synchronized with the reference clock signal). The advanced internal clock signal is propagated to portions of the PLD that are relatively distant from the applied reference clock signal so that the propagation delay brings the internal clock signal back into synchronization with the reference clock signal when it reaches the distant portions of the PLD. In this manner, all portions of the PLD receive substantially synchronous clock signals.

A basic digital DLL circuit includes, for example, a controlled delay line (or delay chain), a phase comparator and a delay setting counter. The controlled delay line receives a reference clock signal, and, in response to the delay setting counter, generates an internal clock signal.

In operation, the reference clock signal is one input to the phase comparator of a DLL circuit. A feedback signal derived from the output of the controlled delay line (which is also the output of the DLL circuit) is fed back to another input of the phase comparator, where the feedback signal is either the same as, or when clock skew is being accounted for, a delayed version of the controlled delay line output. On the basis of a detected phase difference between the reference clock signal and the feedback signal, the phase comparator adjusts the delay setting counter according to whether the feedback signal leads or lags the reference clock signal. Depending on whether the delay setting counter is incremented or decremented, the delay introduced by the controlled delay line is either increased or decreased, respectively. Eventually, the phase of the internal clock signal will track the phase of the reference clock signal.

The situation is similar for PLL circuits. Instead of using a controlled delay line, however, PLL circuits operate through the use of a controlled oscillator that produces a locally generated clock signal (i.e., an internal clock signal) having a frequency equal to the frequency of a reference clock signal. Moreover, because DLL circuits are not concerned with frequency, PLL circuits are typically used when frequency synthesis is required.

Initially, in a PLL circuit, the oscillator is tuned to a frequency close to the frequency of the reference clock signal. At this time, any slight change in phase between the frequency of the reference clock signal first appears as a change in phase between the reference clock signal and the internal clock signal produced by the controlled oscillator. This phase shift, as detected by the phase comparator, acts as an error signal to change the frequency of the oscillator to match the frequency of the reference clock signal. Accordingly, based on readings from the phase comparator, the oscillator is constantly adjusted to match in phase the frequency of the reference clock signal. In this manner, the controlled oscillator provides a clean replica of the reference clock signal frequency.

One consideration when using loop circuits is the fact that their performance is often degraded by the presence of noise. For example, noise coming directly from the reference clock signal, from the power supply or from another component may result in an erroneously detected phase difference between the reference clock signal and the feedback signal. When this happens, the internal clock signal generated by the loop circuit may not accurately track the reference clock signal because the controlled delay line in the DLL circuit or the controlled oscillator in the PLL circuit responds to this erroneous comparison. Moreover, while it is known to use filters in loop circuits, such filters are often detrimentally large and are not suitable for handling noises from varying sources which may have different noise spectral densities.

SUMMARY OF THE INVENTION

In accordance with the principles of the present invention, loop circuits are provided that use phase comparators having a low-pass noise filter. In one implementation, a phase comparator including a low-pass noise filter in accordance with the principles of the present invention is used in a DLL circuit. In another implementation, the phase comparator is used in a PLL circuit. In either case, the low-pass noise filter prevents an erroneous detected phase difference between the reference clock signal and the feedback signal, which may be the result of noise, from resulting in an unnecessary adjustment to the internal clock signal by the compensation circuitry of the loop circuit (i.e., the controlled delay line in a DLL circuit or the controlled oscillator in a PLL circuit).

A phase comparator according to the principles of the present invention includes a phase detector for comparing a reference clock signal with a feedback signal. The feedback signal may be the same as the loop circuit generated internal clock signal, or a delayed version thereof if clock skew is being compensated for. The phase comparators also include a low-pass noise filter for filtering out erroneous comparisons by the phase detector which may be the result of high frequency noise. In this manner, the phase comparators significantly reduce the likelihood that the loop circuit compensation circuitry will improperly adjust the internal clock signal.

The low-pass noise filter includes an up down counter that provides a counter output signal (which is indicative of the counter's current state, or value) to a programmable reset and up down control logic circuit. The up down counter is set to an initial value, and begins to count up or down (i.e., it is incremented or decremented) depending on whether the phase detector measures a lead or lag relationship between the feedback signal and reference clock signal.

Once the up down counter reaches an upper or lower threshold value, as determined by a bandwidth control signal provided to the programmable reset and up down control logic circuit, the control settings for the compensation circuitry are adjusted to bring the feedback signal closer to synchronization with the reference clock signal (i.e., the internal clock signal comes closer to tracking the reference clock signal). Afterwards, in a preferred embodiment, the up down counter is reset to its initial value and the process begins again.

In this manner, by using a filter that requires a certain net number of leading or lagging measurements by the phase detector to occur prior to the control settings for the compensation circuitry being adjusted, the adverse effects of high frequency noise on the ability of the loop circuit to produce an accurate internal clock signal are greatly reduced. Moreover, in various embodiments of the invention, the low-pass filter has a programmable bandwidth. For example, by adjusting a bandwidth control signal, the bandwidth of the low-pass filter can be varied such that the low-pass filter more effectively deals with noise from different sources which may have different spectral densities.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE INVENTION

As described above, the present invention relates to phase comparators for use in DLL and PLL circuits that includes a low-pass noise filter with programmable bandwidth. While phase comparators in accordance with the principles of the present invention for use in DLL circuits are described in more detail below, persons skilled in the art will appreciate that the phase comparators are equally suitable for use in PLL circuits.

Figure 1:
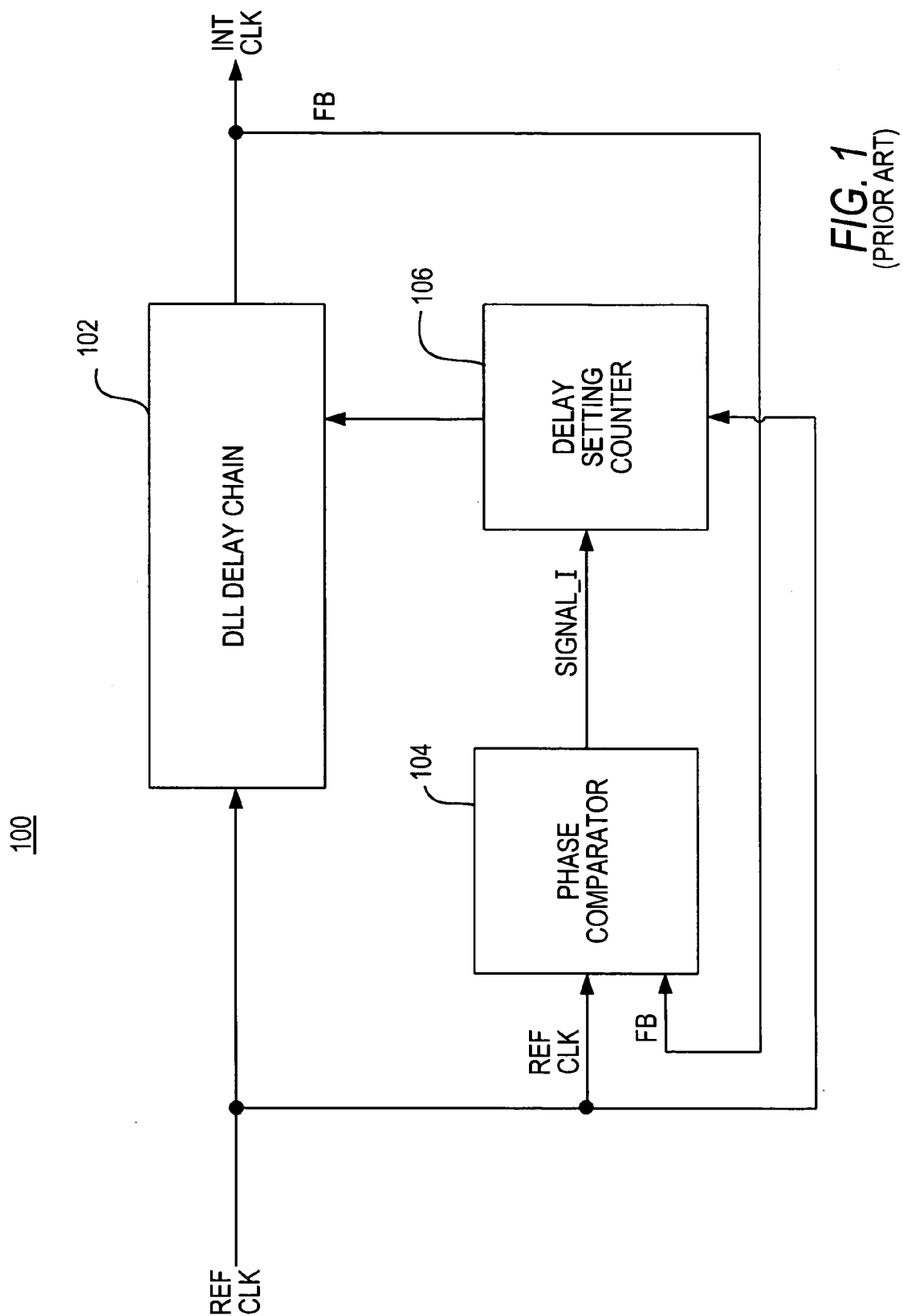
FIG. 1 is a block diagram of a conventional digital DLL circuit.

FIG. 1 shows a block diagram of a conventional digital DLL circuit 100 which may be incorporated, for example, on a PLD. It will be understood that if the circuits of this invention are used in a device such as a PLD, that device can be either field programmable, mask programmable, or programmable in any other way.

In FIG. 1, DLL delay chain 102 acts as a variable delay circuit that delays an external, or reference, clock signal REF CLK to provide an internal clock signal INT CLK. DLL delay chain 102 may be constructed, for example, by an inverter chain (not shown) that includes a plurality of inverters connected in series. In this case, two of the inverters of DLL delay chain 102 would form a delay element having a delay time $T_D$, and depending on how many delay elements are used in providing INT CLK, REF CLK would be delayed by a certain multiple of $T_D$.

A phase comparator 104 compares a feedback signal FB with REF CLK and provides delay setting counter 106 with a signal SIGNAL_I indicative of whether the feedback signal FB leads or lags REF CLK. Persons skilled in the art will appreciate that while the output of DLL circuit 100 (i.e., INT CLK) is used as the feedback signal FB in the circuit of FIG. 1, this is not mandatory. For example, when DLL circuit 100 is being used to help counteract clock skew during distribution due to the delay in clock signals propagating on a PLD, additional delay circuitry (not shown) may be included between the output of DLL circuit 100, INT CLK, and the input to phase comparator 104. If this is the case, because the feedback signal is a delayed version of INT CLK, DLL delay chain 102 will operate to provide an INT CLK that tracks the reference clock but is advanced by an amount equal to the extra delay being introduced by the additional delay circuitry. Thus, the advanced INT CLK can be propagated to portions of the PLD that are relatively distant from the applied REF CLK so that the propagation delay brings INT CLK back into synchronization with REF CLK when it reaches the distant portions of the PLD, thereby permitting all portions of the PLD to receive substantially synchronous clock signals.

Phase comparator 104 of DLL circuit 100 may be, for example, a phase detector (not shown) that is capable of detecting the phase difference between REF CLK and the feedback signal FB. In this case, the phase detector may be as simple as a register, where REF CLK is used to sample the delayed clock (i.e., feedback signal FB). Alternatively, the phase detector may be constructed using a D-type flip-flop (not shown) which has a clock input for receiving REF CLK and a data input for receiving the feedback signal FB. When the phase of the feedback signal FB leads the phase of REF CLK, the output signal of the phase detector, SIGNAL_I, may become a logic high. On the other hand, when the phase of the feedback signal FB lags the phase of REF CLK, SIGNAL_I becomes a logic low.

When feedback signal FB leads or lags REF CLK, this relative phase difference as detected by phase comparator 104 is used to adjust delay setting counter 106. In turn, a signal from delay setting counter 106 is used to control the amount by which DLL delay chain 102 delays REF CLK in providing INT CLK. Namely, if phase comparator 104 determines that the phase of feedback signal FB leads the phase of REF CLK, then phase comparator 104 provides a signal, SIGNAL_I, to increment delay setting counter 106, thereby increasing the amount of delay introduced by DLL delay chain 102 on REF CLK. On the other hand, if phase comparator 104 determines that the phase of feedback signal FB lags the phase of REF CLK, then SIGNAL_I from phase comparator 104 causes delay setting counter 106 to decrement, thereby decreasing the amount by which DLL delay chain 102 delays REF CLK. In this manner, the difference in phase between REF CLK and INT CLK is reduced and eventually brought close to zero.

Conventional DLL circuits such as described above, however, are often susceptible to high frequency noise. For example, high frequency noise may result in an erroneously detected phase difference between the reference clock signal and the feedback signal, thereby adversely affecting the production of an internal clock signal that accurately tracks the reference clock signal.

Figure 2:
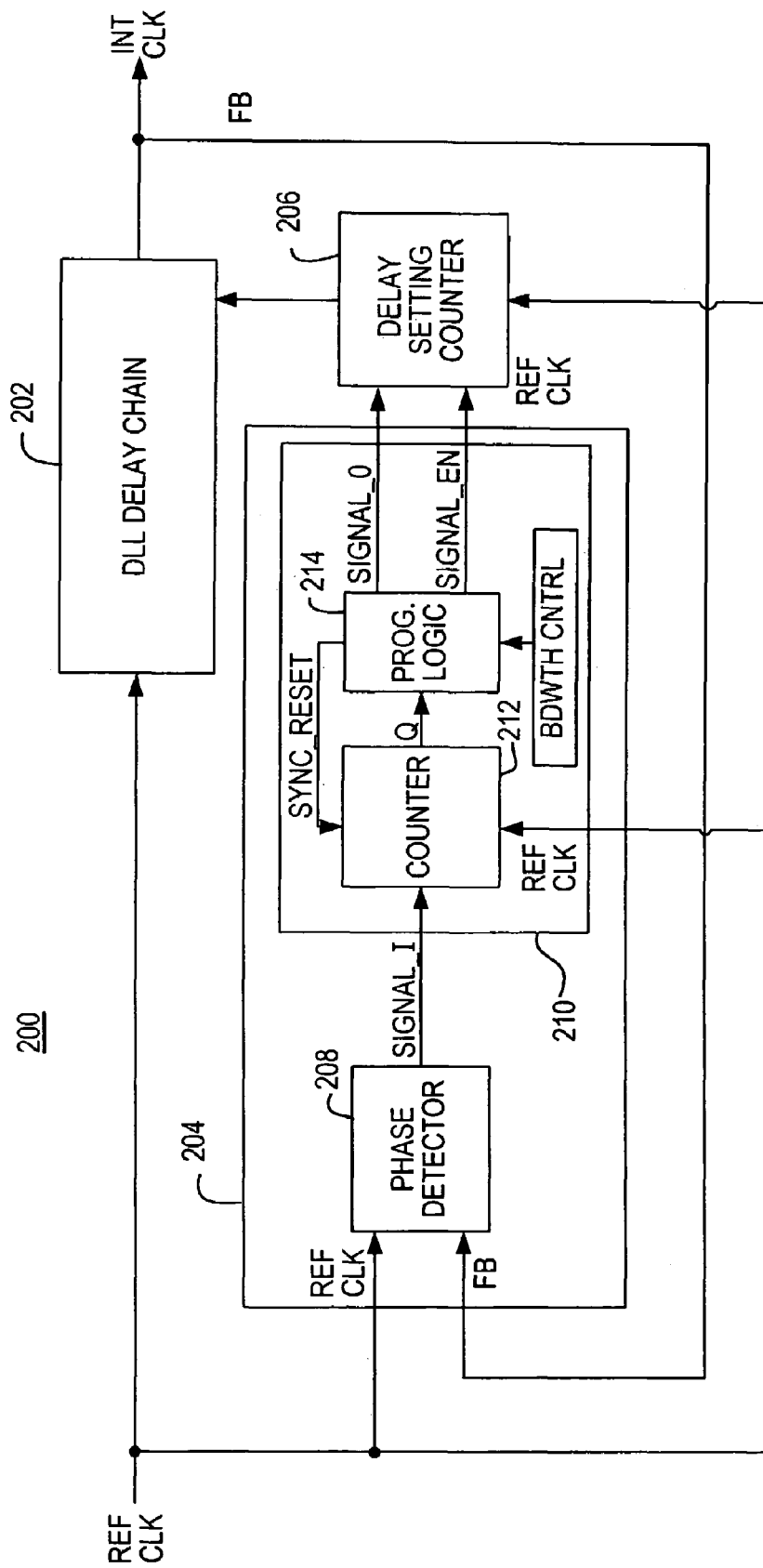
FIG. 2 is a block diagram of a digital DLL circuit including a phase comparator constructed in accordance with the principles of the present invention.

FIG. 2 shows a block diagram of a digital DLL circuit 200 constructed in accordance with the principles of the present invention that produces an internal clock signal INT CLK based on a reference clock signal REF CLK. Similar to DLL circuit 100, DLL circuit 200 may be incorporated, for example, on a PLD for the purpose of providing an accurate internal clock signal to various parts of the PLD.

DLL circuit 200 includes a DLL delay chain 202, a phase comparator 204 and a delay setting counter 206. DLL delay chain 202 and delay setting counter 206 operate in much the same way as the comparable circuits of FIG. 1 (i.e., DLL delay chain 102 and delay setting counter 106, respectively). Unlike phase comparator 104 of FIG. 1, however, phase comparator 204 includes not only phase detection circuitry but also circuitry for eliminating or at least reducing the effects of high frequency noise on the production of INT CLK.

Phase comparator 204 includes a phase detector 208, which may be similar to the phase detector described above in connection with phase comparator 104. As shown in FIG. 2, phase comparator 204 also includes a low-pass noise filter with programmable bandwidth ("filter") 210. The outputs of filter 210 (i.e., SIGNAL_O and SIGNAL_EN), which are also the outputs of phase comparator 204, are used to control delay setting counter 206 to count up, count down, or remain unchanged. The following is a table illustrating the manner in which SIGNAL_O and SIGNAL_EN, which are described in greater detail below, control delay setting counter 206.

TABLE 1

DELAY SETTING COUNTER LOGIC TABLE

| SIGNAL_EN | SIGNAL_O | Delay Setting Counter 206 |
|---|---|---|
| 0 | X | No Change |
| 1 | 1 | Count UP |
| 1 | 0 | Count Down |

As illustrated by Table 1, the only time that SIGNAL_O adjusts delay setting counter 206, which controls the amount of delay introduced by DLL delay chain 202 in producing REF CLK, is when SIGNAL_EN is a logic high. On the other hand, when SIGNAL_EN is a logic low, delay setting counter 206 is unchanged by SIGNAL_O regardless of whether SIGNAL_O is a logic high or a logic low.

Filter 210, as shown in FIG. 2, includes an up down counter ("counter") 212 and a programmable reset and up down control logic circuit ("programmable logic") 214. Filter 210 serves to prevent an erroneously detected phase difference between the reference clock signal and the feedback signal, which may be due to high frequency noise, from resulting in an adjustment to delay setting counter 206. In particular, as described in detail below, filter 210 requires that counter 212 be incremented or decremented a certain net number of times before delay setting counter 206 is adjusted.

In addition to guarding against erroneously detected phase differences that result from noise, filter 210 may also be used to prevent unnecessary adjustments to delay setting counter 206 that are likely to occur once INT CLK is tracking REF CLK. Namely, because phase differences that are less than a certain amount cannot be accurately detected by phase detector 208, phase detector 208 is likely to fluctuate between lead and lag readings once INT CLK is tracking REF CLK (i.e., their phases are synchronized or a desired phase difference is being maintained). Using filter 210, however, such fluctuating readings would generally not affect delay setting counter 206 because they would cancel each other out.

Assuming, for example, that counter 212 is a four bit counter designed to accumulate four ups or four downs (i.e., a net number of four lead or lag comparisons is needed before delay setting counter 206 is adjusted), filter 210 operates as follows. The four bits of counter 212 are initially set, for example, to 1000. If SIGNAL_I is a logic high (e.g., because phase detector 208 measures the phase of the feedback signal FB as leading the phase of REF CLK), then counter 212 will count up by one. On the other hand, if SIGNAL_I is a logic low (e.g., because the phase of the feedback signal FB if measured by phase detector 208 to lag the phase of REF CLK), then counter 212 will instead count down by one. Following each comparison of REF CLK and the feedback signal FB, which occurs at the same frequency as REF CLK, programmable logic 214 compares the level of counter 212 (i.e., using counter output Q) with the programmable bandwidth control signal BDWTH CNTRL.

It will be understood that BDWTH CNTRL may be provided directly by user inputs. Accordingly, in accordance with the principles of the present invention, filter 210 has a programmable bandwidth and, as such, filter 210 is able to efficiently prevent high frequency noise with different spectral densities from transferring to the delay setting of DLL circuit 200. Alternatively, instead of from user inputs, BDWTH CNTRL may also be provided by RAM bits in the PLD, or by any other suitable source.

In comparing counter 212 with BDWTH CNTRL, programmable logic 214 determines if counter 212 has reached either the upper or lower threshold value set by BDWTH CNTRL. When it has, programmable logic 214 SIGNAL_EN is set to a logic high and, depending on the value of most significant bit of counter 212, sets SIGNAL_O to either a logic high or a logic low (i.e., if the most significant bit of counter 212 is "1," SIGNAL_O is a logic high, otherwise, SIGNAL_O is a logic low).

For example, assuming the eight bits of BDWTH CNTRL are set to 11000100, the upper threshold level described above will correspond to the four most significant bits of BDWTH CNTRL, 1100, while the lower threshold level described above will correspond to the four least significant bits of BDWTH CNTRL, 0100. Accordingly, when counter 212 reaches 1100, SIGNAL_EN and SIGNAL_O will both be set to a logic high. This, in turn, causes delay setting counter 206 to be incremented and the delay on REF CLK introduced by DLL delay chain 202 to increase. Conversely, when counter 212 reaches 0100, SIGNAL_EN will be set to a logic high while SIGNAL_O is set to a logic low. At this time, delay setting counter 206 is decremented and the delay on REF CLK introduced by DLL delay chain 202 is decreased. In addition, once counter 212 has reached either 1100 or 0100, programmable logic 214 sets synchronous reset signal SYNC_RESET to a logic high, causing counter 212 to be reset back to 1000. The truth table for programmable logic 214 is provided by the following table.

TABLE 2

PROGRAMMABLE LOGIC TRUTH TABLE

| BDWTH CNTRL | Counter 212 | SIGNAL_O | SIGNAL_EN | SYNC_RESET |
|---|---|---|---|---|
| 11000100 | 0000 | 0 | 0 | 1 |
| 11000100 | 0001 | 0 | 0 | 0 |
| 11000100 | 0010 | 0 | 0 | 0 |
| 11000100 | 0011 | 0 | 0 | 0 |
| 11000100 | 0100 | 0 | 1 | 1 |
| 11000100 | 0101 | 0 | 0 | 0 |
| 11000100 | 0110 | 0 | 0 | 0 |
| 11000100 | 0111 | 0 | 0 | 0 |
| 11000100 | 1000 | 1 | 0 | 0 |
| 11000100 | 1001 | 1 | 0 | 0 |
| 11000100 | 1010 | 1 | 0 | 0 |
| 11000100 | 1011 | 1 | 0 | 0 |
| 11000100 | 1100 | 1 | 1 | 1 |
| 11000100 | 1101 | 1 | 0 | 0 |
| 11000100 | 1110 | 1 | 0 | 0 |
| 11000100 | 1111 | 1 | 0 | 1 |

Ideally, when SYNC_RESET functions in the manner described above, counter 212 will remain between 1100 and 0100. However, if by error counter 212 exceeds the upper or lower threshold level set by BDWTH CNTRL and ultimately reaches either 1111 or 0000, then as illustrated by Table 2, SYNC_RESET resets counter 212 to 1000. Persons skilled in the art will appreciate that, alternatively, programmable logic 214 may be designed such that SYNC_RESET resets counter 212 to 1000 anytime counter 212 goes above 1100 or below 0100 (i.e., programmable logic 214 does not wait until counter 212 reaches either 1111 or 0000 to set SYNC_RESET to a logic high).

To provide more rapid adjustments to INT CLK, moreover, it may also be desirable to configure SYNC_RESET to reset counter 212, for example, only when counter 212 has reached either 1111 or 0000. In this case, once four net ups or downs have been accumulated by counter 212, each subsequent measurement by phase detector 208 may result in further adjustment to delay setting counter 206 and thus to INT CLK (instead of resetting counter 212 and thus requiring that, once again, four net ups or downs be achieved before further adjustment to delay setting counter 206 is made). The invention is not limited in this manner.

Persons skilled in the art will further appreciate that, by adjusting BDWTH CNTRL, the bandwidth of low-pass filter 210 may be controlled as desired. In particular, DLL circuit 200 may be customized to deal with different noise spectral densities (which may result, for example, from different sources of noise or different applications of DLL circuit 200). For example, if BDWTH CNTRL is set to 11010101, then delay setting counter 206 would only be adjusted when counter 212 reaches either 1101 or 0101. It should be understood that the present invention is not limited by the particular bandwidth signal BDWTH CNTRL applied to programmable logic 214. Moreover, the present invention is also not limited by the size (i.e., number of bits) of counter 212 or the preset (and reset) value of counter 212, both of which may be altered without departing from the spirit of the present invention.

Figure 3:
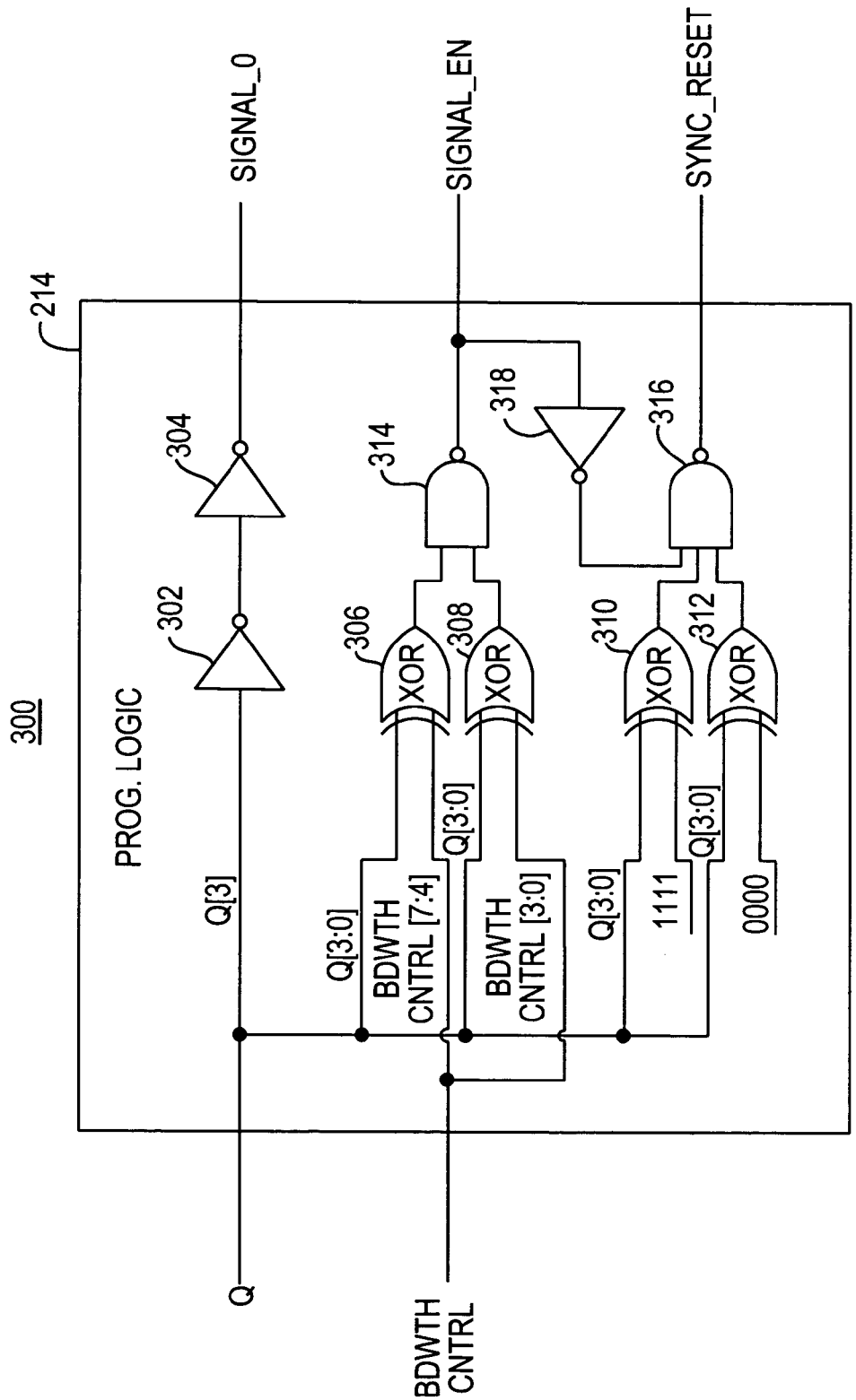
FIG. 3 is a schematic diagram of one embodiment of the programmable reset and up down control logic of FIG. 2 constructed in accordance with the principles of the present invention.

FIG. 3 is a schematic diagram 300 of one embodiment of programmable logic 214 constructed in accordance with the principles of the present invention. As shown in both FIG. 2 and FIG. 3, programmable logic 214 receives as its inputs the four bits of counter 212 (through counter output Q) and BDWTH CNTRL and outputs three signals, namely, SIGNAL_O, SIGNAL_EN and SYNC_RESET.

The most significant bit of counter 212 is passed through inverters 302 and 304 to provide SIGNAL_O, which is provided to delay setting counter 206. Accordingly, as illustrated by Table 2 provided above, SIGNAL_O is a logic high anytime that the value of counter 212 is between 1111 and 1000. On the other hand, when counter 212 is between 0111 and 0000, SIGNAL_O is a logic low. As noted above, however, a properly functioning SYNC_RESET will prevent counter 212 from rising above 1100 or below 0100.

Meanwhile, XOR gates 306, 308, 310 and 312, NAND gates 314 and 316, and inverter 318 are used to provide SIGNAL_EN to delay setting counter 206 and to provide SYNC_RESET to counter 212. As shown in FIG. 3, XOR gate 306 receives all four bits of counter 212 and compares it to the four most significant bits of BDWTH CNTRL. Unless the four bits of counter 212 and the four most significant bits of BDWTH CNTRL are identical, the output of XOR gate 306 is a logic high. For example, assuming BDWTH CNTRL is set to 11000100, XOR gate 306 will only provide a logic low output if the value of counter 212 is equal to 1100. If this is the case, then regardless of the output of XOR gate 308, NAND gate 314 will provide at its output a logic high, and thus, SIGNAL_EN will be a logic high. Similarly, because XOR gate 308 compares the four bits of counter 212 with the four least significant bits of BDWTH CNTRL, which given the example of BDWTH CNTRL above are 0100, the output of XOR gate 308 is only a logic low if counter 212 is equal to 0100. If this is the case, the output of NAND gate 314 and thus SIGNAL_EN will again be a logic high.

As illustrated by Table 1 provided above, when SIGNAL_EN is a logic high, SIGNAL_O will adjust delay setting counter 206. Moreover, because of inverter 318, the output of NAND gate 316 will also necessarily be a logic high any time that SIGNAL_EN is a logic high. Accordingly, SYNC_RESET will be a logic high, causing counter 212 to reset to 1000, when SIGNAL_EN becomes a logic high. Moreover, if counter output Q is either 1111 or 0000, a similar result will occur (i.e., SYNC_RESET will be a logic high) because either the output of XOR gate 310 or XOR gate 312 will be a logic low.

As previously explained, instead of waiting for counter 212 to reach either 1111 or 0000 in the event that SYNC_RESET fails to reset counter 212 upon reaching the upper or lower threshold level of BDWTH CNTRL, SYNC_RESET may alternatively be designed to reset counter 212 to 1000 anytime the value of counter 212 is higher than 1100 or lower than 0100. This can be accomplished, for example, by using additional XOR gates (not shown) to also compare the four bits of counter output Q to 0001, 0010, 0011, 1101 and 1110, and providing the outputs of these XOR gates to the input of NAND gate 316. In this manner, anytime the value of counter 212 is higher than 1000 or lower than 0100, SYNC_RESET will be a logic high.

Figure 4:
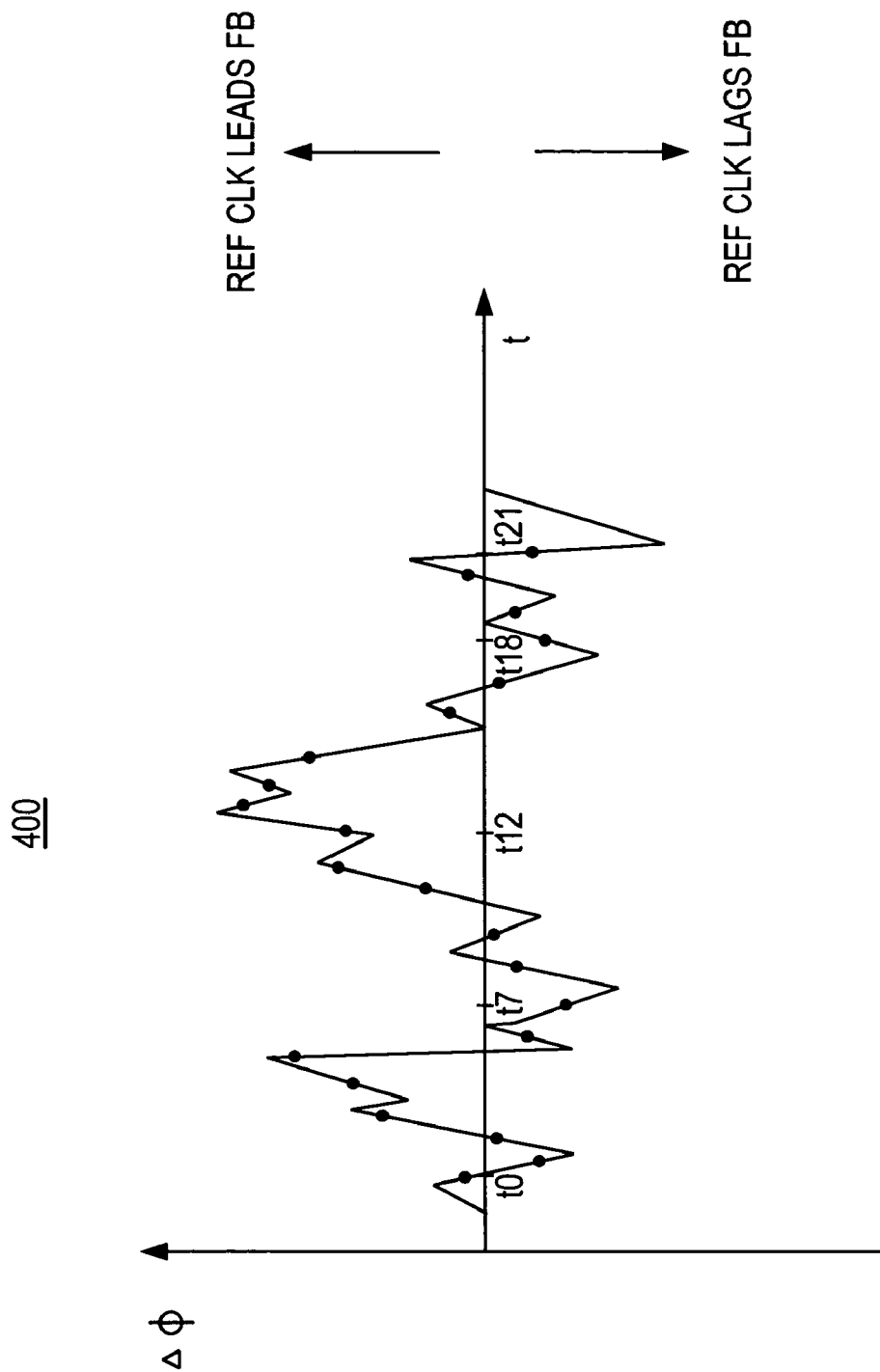
FIG. 4 is a plot illustrating one example of how the detected phase difference between a reference clock signal and a feedback signal (i.e., INT CLK or a delayed version of INT CLK) may be affected as a result of high frequency noise.

FIG. 4 is a plot illustrating an example of how the detected phase difference, $\Delta\phi$, between REF CLK and feedback signal FB may be affected by the presence of high frequency noise. As mentioned above, the times at which REF CLK and feedback signal FB are compared depend on the frequency of REF CLK, and are shown as times t0 through t21 in FIG. 4.

As described above, in accordance with the principles of the present invention to eliminate or at least reduce the effects of high frequency noise on the production of INT CLK, delay setting counter 206 will not change with every comparison of REF CLK and the feedback signal FB. Rather, only after a certain number n (equal to four in the examples provided herein) of net ups or downs have accumulated in counter 212 will delay setting counter 206 be adjusted. Accordingly, intermittent inaccuracies in the lead or lag measurements made by phase detector 208 will be canceled out and will thus not cause an unnecessary adjustment of delay setting counter 206. The bandwidth of filter 210, moreover, can be described as directly related to the number n, where the first order estimate of the noise bandwidth is $f_{in}/n$ ($f_{in}$ being the frequency of REF CLK). Accordingly, it will be appreciated by persons skilled in the art that the greater the number n of net ups or downs that must accumulate by counter 212 before delay setting counter 206 is adjusted, the lower the passing frequency of low-pass filter 210.

The logic table illustrating the manner in which delay setting counter 206 will is adjusted based on lead and lag measurements made by phase detector 208, assuming BDWTH CNTRL is set to 11000100 and given the measured phase differences shown in FIG. 4, is provided below.

REF CLK is found to lag the feedback signal FB, SIGNAL_I changes to a logic low. Therefore, counter 206 returns to 1000 at the next time period (i.e., at t2). Filter 210 continues to cancel out the changes of SIGNAL_I in this manner until time tl6.

At tl6, counter 212 changes from 1011 to 1100 based on the logic high SIGNAL_I at t15. Again, SIGNAL_O is a logic high given that the most significant bit of counter 212 is a "1". Because counter 212 is now equal to the upper threshold value set by BDWTH CNTRL (i.e., set by the four most significant bits of BDWTH CNTRL), moreover, SIGNAL_EN changes from a logic low to a logic high. The logic level of SIGNAL_O, which at this time is a logic high, is thus used to adjust delay setting counter 206 upwards, thereby causing the delay introduced by DLL delay chain 202 to increase in order to bring INT CLK closer to synchronization with REF CLK. Additionally, as illustrated by Table 3, SYNC_RESET goes high at time tl6, causing counter 212 to reset to 1000 at the next clock interval. The process as described above then repeats indefinitely.

Figure 5:
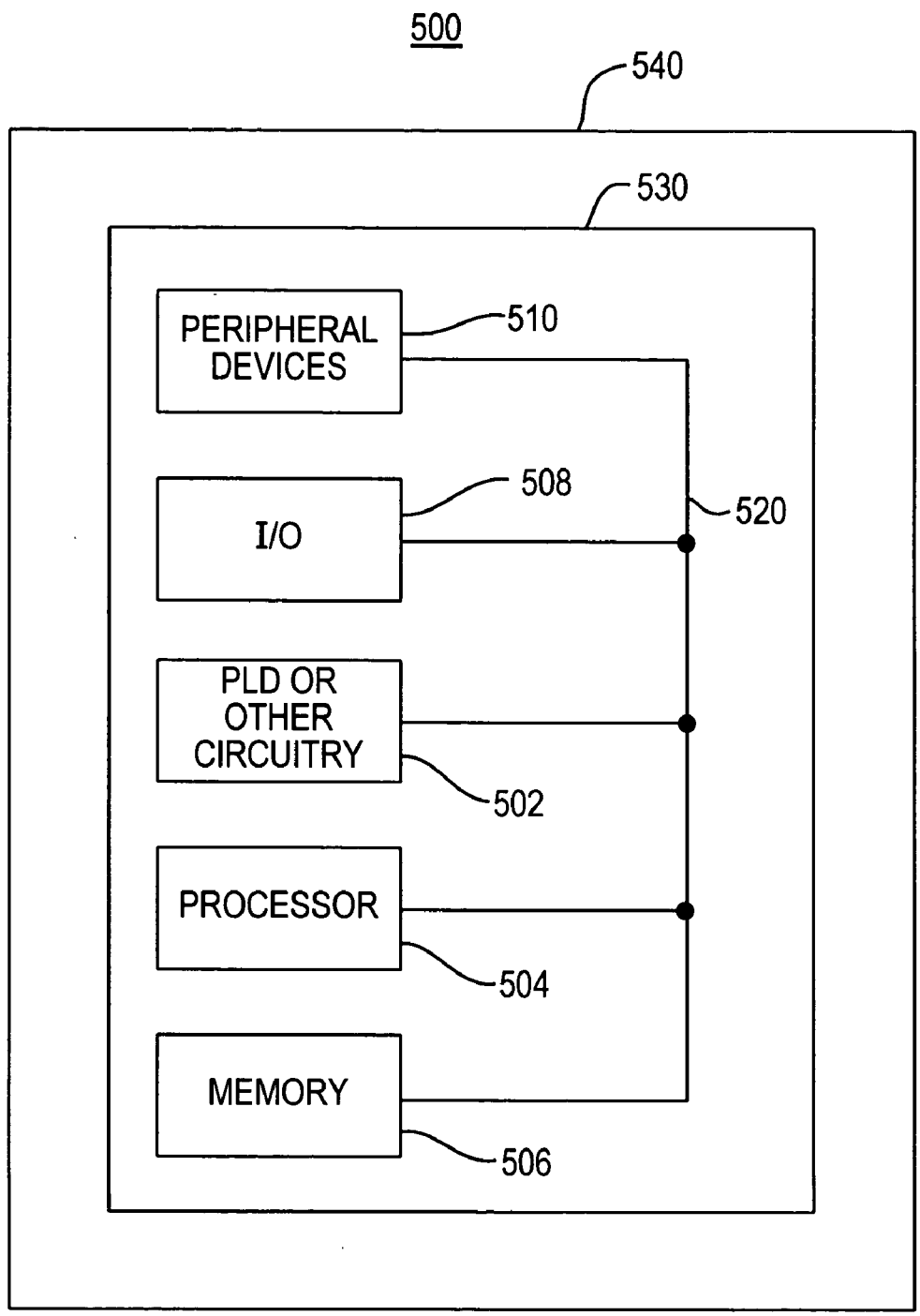
FIG. 5 is a simplified block diagram of an illustrative system employing a programmable logic device having DLL or PLL circuitry in accordance with the principles of the present invention.

It will be understood that the loop circuitry, and in particular the phase comparators of this invention, have many possible applications. FIG. 5 illustrates a data processing system 500 which includes a PLD or other circuitry 502 in accordance with this invention. Data processing

TABLE 3

CHANGES IN DELAY SETTING COUNTER 206

| Time | SIGNAL_I | Counter 212 | SIGNAL_O | SIGNAL_EN | SYNC_RESET | Change |
|---|---|---|---|---|---|---|
| t0  | 1 | 1000 | 1 | 0 | 0 | N/A |
| t1  | 0 | 1001 | 1 | 0 | 0 | N/A |
| t2  | 0 | 1000 | 1 | 0 | 0 | N/A |
| t3  | 1 | 0111 | 0 | 0 | 0 | N/A |
| t4  | 1 | 1000 | 1 | 0 | 0 | N/A |
| t5  | 1 | 1001 | 1 | 0 | 0 | N/A |
| t6  | 0 | 1010 | 1 | 0 | 0 | N/A |
| t7  | 0 | 1001 | 1 | 0 | 0 | N/A |
| t8  | 0 | 1000 | 1 | 0 | 0 | N/A |
| t9  | 0 | 0111 | 0 | 0 | 0 | N/A |
| t10 | 1 | 0110 | 0 | 0 | 0 | N/A |
| t11 | 1 | 0111 | 0 | 0 | 0 | N/A |
| t12 | 1 | 1000 | 1 | 0 | 0 | N/A |
| t13 | 1 | 1001 | 1 | 0 | 0 | N/A |
| t14 | 1 | 1010 | 1 | 0 | 0 | N/A |
| t15 | 1 | 1001 | 1 | 0 | 0 | N/A |
| t16 | 1 | 1100 | 1 | 1 | 1 | UP |
| t17 | 0 | 1000 | 1 | 0 | 0 | N/A |
| t18 | 0 | 0111 | 0 | 0 | 0 | N/A |
| t19 | 0 | 0110 | 0 | 0 | 0 | N/A |
| t20 | 1 | 0101 | 0 | 0 | 0 | N/A |
| t21 | 0 | 0110 | 0 | 0 | 0 | N/A |

As illustrated by Table 3, counter 212 is initially set to 1000. At t0, when phase detector 208 determines that REF CLK leads the feedback signal FB, SIGNAL_I goes high. Because the most significant bit of counter 212 is a logic high, SIGNAL_O becomes a logic high as well. However, given that counter 212 has not reached either 1100 or 0100, SIGNAL_EN and SYNC_RESET both remain a logic low and delay setting counter 206 is unchanged.

At the next comparison between REF CLK and feedback signal FB (i.e., at t1), counter 212 is incremented to 1001. Again, SIGNAL_O is a logic high because the most significant bit of counter 212 is a "1". SIGNAL_EN and SYNC_RESET also both remain a logic low because counter 212 has not reached either 1100 or 0100, and delay setting counter 206 thus remains unchanged. Also, because at t1 system 500 may include one or more of the following components: a processor 504; memory 506; I/O circuitry 508; and peripheral devices 510. These components are coupled together by a system bus or other interconnections 520 and are populated on a circuit board 530 that is contained in an end-user system 540.

System 500 can be used in a wide variety of applications, such as computer networking, data networking, instrumentation, video processing, digital signal processing, or any other application. Circuitry 510 may be used to perform a variety of different logic functions. For example, circuitry 510 may be configured as a processor or controller that works in cooperation with processor 504. Circuitry 510 may also be used as an arbiter for arbitrating access to a shared resource in system 500. In yet another example, circuitry 502 can be configured as an interface between processor 504 and one of the other components in system 500. It should be noted that system 500 is only exemplary, and that the true scope and spirit of the invention should be indicated by the following claims.

Moreover, various technologies can be used to implement PLDs (like the circuitry 502 in FIG. 5 and the circuitry shown in the FIGS. 1–4). For example, the technology used can be based on EPROMs, EEPROMs, pass transistors, transmission gates, antifuses, laser fuses, metal optional links, mask programmability, function control registers (e.g., as in Wahlstrom U.S. Pat. No. 3,473,160), etc. The invention is not limited in this manner.

It should be noted that, for the purpose of simplifying the description of the invention, phase comparators in accordance with the principles of the present invention have been explained above in detail for use in a DLL circuit. Persons skilled in the art will appreciate, however, that the invention is not limited in this manner. As explained above, the principles of the present invention also apply to other types of loop circuits (e.g., PLL circuits). For example, a phase comparator including a phase detector and a low-pass noise filter with programmable bandwidth as described above may be used for the purpose of reducing the effects of high frequency noise on the output of the controlled oscillator in a PLL circuit. For instance, the low-pass noise filter may be used to prevent an erroneously detected phase difference between the reference clock signal and the oscillator signal from resulting in an unnecessary adjustment to the frequency of the internal clock signal generated by the controlled oscillator.

Moreover, it will also be understood that the principles of the present invention are not limited to the specific embodiments described above. For example, instead of using up down counter 212, DLL circuit 200 may use an adder plus registers to accumulate ups and downs, where adding one works like a count up and subtracting one works like a count down. Meanwhile, although all digital loop circuits have been described herein, partially analog loop circuits may also utilize a phase comparator in accordance with the principles of the present invention. The scope of the present invention is not limited in this manner.

The above described embodiments of the present invention are presented for purposes of illustration and not of limitation, and the present invention is limited only by the claims which follow.

What is claimed is:

1. A loop circuit for producing an internal clock signal that tracks a received reference clock signal comprising:
 a phase comparator for comparing a feedback signal derived from said internal clock signal with said reference clock signal;
 a setting counter that is adjusted by said phase comparator after a selectable net number of either lead or lag comparisons has been counted by said phase comparator, wherein the selectable net number is determined by a bandwidth control signal; and
 a compensation component for receiving said reference clock signal and, based on said setting counter, producing said internal clock signal.

2. The loop circuit of claim 1 wherein said feedback signal is substantially the same signal as said internal clock signal.

3. The loop circuit of claim 1 wherein said feedback signal is a delayed version of said internal clock signal.

4. The loop circuit of claim 1 wherein said reference clock signal is a clock signal from circuitry external to said loop circuit.

5. The loop circuit of claim 1 wherein said reference clock signal is received from an oscillator.

6. The loop circuit of claim 1 wherein said phase comparator comprises:
 a phase detector for producing lead or lag output signals indicative of a measured phase difference between said feedback signal and said reference clock signal.

7. The loop circuit of claim 6 wherein said phase comparator further comprises:
 a low-pass noise filter for receiving said lead or lag output signals from said phase detector, said low-pass noise filter adjusting said setting counter after said selectable net number of either lead or lag comparisons by said phase detector.

8. The loop circuit of claim 7 wherein said low-pass noise filter comprises:
 an up down counter that is set to an initial value, said up down counter that is incremented or decremented based on said lead or lag output signals from said phase detector; and
 a programmable logic circuit operatively coupled between said up down counter and said setting counter that adjusts said setting counter once said up down counter reaches an upper or lower threshold value.

9. The loop circuit of claim 8 wherein said low-pass noise filter has a programmable bandwidth, at least one of said upper and lower threshold values of said programmable logic circuit being controlled by said bandwidth control signal.

10. The loop circuit of claim 9 wherein said bandwidth control signal is provided directly by user inputs.

11. The loop circuit of claim 9 wherein said bandwidth control signal is provided by RAM bits from a programmable logic device.

12. The loop circuit of claim 9 wherein said bandwidth control signal is adjustable during operation of said loop circuit.

13. The loop circuit of claim 8 wherein said up down counter is reset to said initial value once said setting counter has been adjusted.

14. The loop circuit of claim 8 wherein said setting counter is not reset once said setting counter has been adjusted.

15. The loop circuit of claim 8 wherein said setting counter is reset to a value other than said initial value once said setting counter has been adjusted.

16. The loop circuit of claim 8 wherein said up down counter is reset to said initial value once said up down counter reaches its maximum or minimum counter value.

17. The loop circuit of claim 8 wherein said up down counter is reset to said initial value once said up down counter reaches a reset level.

18. The loop circuit of claim 1 wherein:
 said loop circuit is a delay-locked loop circuit; and
 said compensation component comprises a controlled delay line for producing said internal clock signal.

19. A programmable logic device comprising the loop circuit of claim 1.

20. A digital processing system comprising:
 processing circuitry;
 a memory coupled to said processing circuitry; and
 the programmable logic device defined in claim 19 coupled to the processing circuitry and the memory.

21. A printed circuit board on which is mounted the programmable logic device defined in claim 19.

22. The printed circuit board defined in claim 21 further comprising:

memory circuitry mounted on the printed circuit board and coupled to the programmable logic device.

23. The printed circuit board defined in claim 22 further comprising:
processing circuitry mounted on the printed circuit board and coupled to the memory circuitry.

24. An integrated circuit device comprising the loop circuit of claim 1.

25. A digital processing system comprising:
processing circuitry;
a memory coupled to said processing circuitry; and
the integrated circuit device defined in claim 24 coupled to the processing circuitry and the memory.

26. A printed circuit board on which is mounted the integrated circuit device defined in claim 24.

27. The printed circuit board defined in claim 26 further comprising:
memory circuitry mounted on the printed circuit board and coupled to the integrated circuit device.

28. The printed circuit board defined in claim 27 further comprising:
processing circuitry mounted on the printed circuit board and coupled to the memory circuitry.

29. A loop circuit for producing an internal clock signal that tracks a received reference clock signal comprising:
a phase comparator for comparing a feedback signal derived from said internal clock signal with said reference clock signal; and
a compensation component for producing said internal clock signal based on said reference clock signal, said compensation component adjusting said internal clock signal after a selectable net number of either lead or lag comparisons has been counted by said phase comparator, wherein said selectable net number is determined by a bandwidth control signal.

30. The loop circuit of claim 29 wherein said bandwidth control signal is provided directly by user inputs.

31. The loop circuit of claim 29 wherein said bandwidth control signal is provided by RAM bits from a programmable logic device.

32. The loop circuit of claim 29 wherein said bandwidth control signal is adjustable during operation of said loop circuit.

33. A method of producing an internal clock signal that tracks a received reference clock signal comprising:
comparing the phase of a feedback signal derived from said internal clock signal with the phase of said reference clock signal;
counting the number of lead or lag comparisons made between the phase of said internal clock signal and the phase of said reference clock signal; and
using a compensation component for producing said internal clock signal based on said feedback signal, said compensation component adjusting said internal clock signal after a selectable net number of either lead or lag comparisons has been counted in the counting, wherein said selectable net number is determined by a bandwidth control signal.

34. The method of claim 33 wherein said bandwidth control signal is provided directly by user inputs.

35. The method of claim 33 wherein said bandwidth control signal is provided by RAM bits from a programmable logic device.

36. The method of claim 33 wherein said bandwidth control signal is adjustable during said production of said internal clock signal by said compensation component.

* * * * *